United States Patent [19]

Kuhara et al.

[11] Patent Number: 5,703,815

[45] Date of Patent: Dec. 30, 1997

[54] HIGH-SPEED SEMICONDUCTOR MEMORY SYSTEM

[75] Inventors: Shigeru Kuhara; Hideo Toyoshima, both of Tokyo, Japan

[73] Assignee: NEC Corporation, Tokyo, Japan

[21] Appl. No.: 802,449

[22] Filed: Feb. 18, 1997

Related U.S. Application Data

[62] Division of Ser. No. 619,324, Mar. 21, 1996, abandoned.

[30] Foreign Application Priority Data

Mar. 24, 1995 [JP] Japan ................................... 7-91415

[51] Int. Cl.$^6$ ................................................ G11C 7/00
[52] U.S. Cl. ................................ 365/194; 365/230.06
[58] Field of Search ................................ 365/194, 205, 365/207, 208, 190, 230.06

[56] References Cited

U.S. PATENT DOCUMENTS

| | | | |
|---|---|---|---|
| 4,740,923 | 4/1988 | Kaneko et al. | 365/194 |
| 4,797,573 | 1/1989 | Ishimoto | 365/194 |
| 4,802,127 | 1/1989 | Akaogi et al. | 365/194 |
| 4,953,130 | 8/1990 | Houston | 365/194 |
| 5,210,715 | 5/1993 | Houston | 365/194 |
| 5,406,518 | 4/1995 | Sun et al. | 365/194 |
| 5,467,313 | 11/1995 | Jung et al. | 365/194 |
| 5,579,267 | 11/1996 | Koshikawa | 365/194 |

OTHER PUBLICATIONS

D. Wong et al.; "WP3.6: A Bipolar Population Counter Using Wave Pipelining to Achieve 2.5x Normal Clock Frequency"; 1992 IEEE International Solid–State Circuits Conference, pp. 56–57.

K. Nakamura et al.; "A 220–MHz Pipelined 16–Mb BiCMOS SRAM with PLL Proportional Self–Timing Generator"; IEEE Journal of Solid–State Circuits, vol. 29, No. 11, Nov. 1994, pp. 1317–1322.

S. Kuhara et al.; "A 220MHz Pipelined 16Mb BiCMOS SRAM with PLL Proportional Self–Timing Generator"; Technical Report of IEICE, SDM94–32, ICD94–43 (1994–05) pp. 69–76.

*Primary Examiner*—Tan T. Nguyen
*Attorney, Agent, or Firm*—Whitham, Curtis, Whitham & McGinn

[57] ABSTRACT

A semiconductor memory system is provided in which a wave-pipeline operational frequency is enhanced by reducing the cycle time through a reduction in a difference in the signal delay time caused by differences of data path lengths. A delay circuit is inserted into a signal path having a smaller delay time between an address input section and data output section, thereby reducing a difference in the signal delay time caused by differences of data path lengths, which in turn reduces the cycle time to enhance the wave-pipeline operational frequency. Alternatively, an arrangement may be made to increase the signal delay time of a driver and/or sense amplifier for a smaller signal path length. In another aspect, a maximum differences in voltage drops between memory cells is reduced by controlling the resistance of a charge section for a bit line.

7 Claims, 8 Drawing Sheets

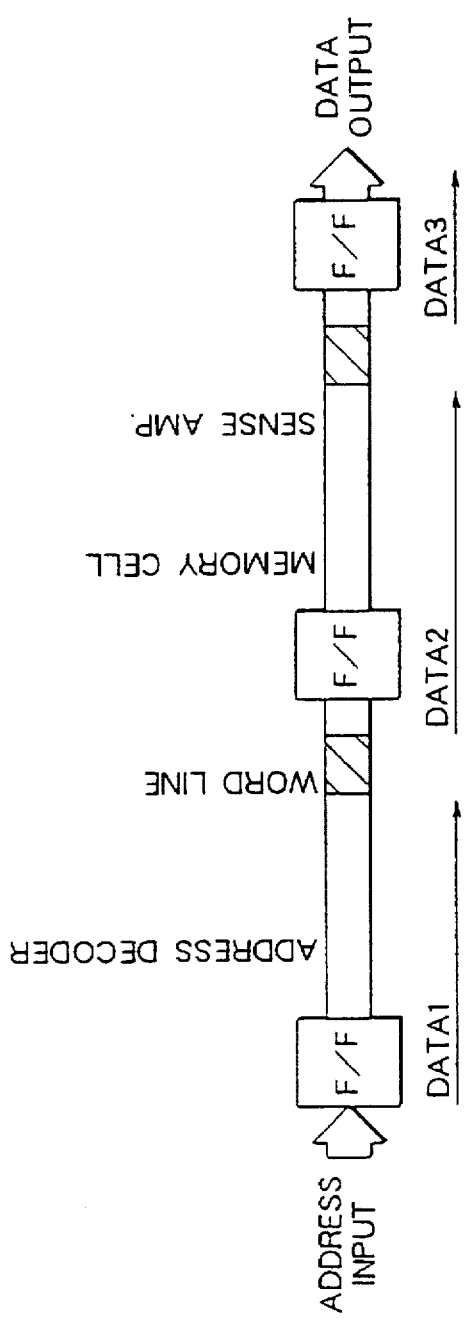
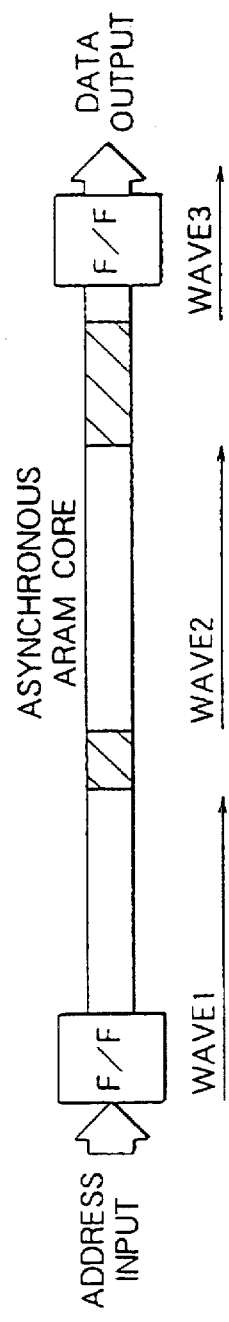
FIG. 2A PRIOR ART
FIG. 2B PRIOR ART

HIGH-SPEED SEMICONDUCTOR MEMORY SYSTEM

This is a Divisional Application of application No. 08/619,324 filed Mar. 21, 1996 abandoned.

BACKGROUND OF THE INVENTION

(a) Field of the Invention

The present invention relates to a high-speed semiconductor memory system and, in particular, to a high-speed semiconductor memory system of a wave-pipeline technique.

(b) Description of the Related Art

A conventional memory system is schematically shown in FIG. 1, which comprises an input section 12 for receiving an address signal, a decoder 13 for decoding an address signal, a memory cell array 11 including a plurality of memory cells disposed in an array, a sense amplifier 14 for detecting a potential change on a bit line connected to a selected memory cell in the memory cell array 11 to thereby read data therefrom, and an output section 15 to which an output signal from the sense amplifier 14 is input and from which output data is delivered.

A pipeline technique used in a combinational circuit may be applied to enhance the operational frequency of the memory system of FIG. 1, as schematically shown in FIG. 2A, in which data signals DATA1 to DATA3 are concurrently transmitted by storage elements (flip-flops) along the signal path extending between the input section 12 and the output section 15, both of which constitute flip-flops, with the intermediate flip-flop disposed therebetween.

An improved pipeline technique known as a "wave-pipeline technique" is proposed for further enhancing the operational frequency of the conventional pipeline technique of FIG. 2A. The wave-pipeline technique, such as shown in FIG. 2B is disclosed in detail in an article "A Bipolar Population Counter Using Wave-Pipelining to Achieve 2.5×Normal Clock Frequency", by Derek Wong et al. IEEE International Solid-State Circuit Conference (ISSCC) Digest Technical Papers, pp 56–57, February 1992. In this technique, a plurality of signals are propagated on the data path as-wave signals WAVE1 to WAVE3. With this technique, an operation which is equivalent to a conventional two-stage pipeline technique illustrated in FIG. 2A is realized without interference and with a reduction in the power dissipation and the chip area.

In the wave-pipeline technique of FIG. 2B, the operational speed of the system is improved without using intermediate registers or latch circuits. That is, a plurality of coherent data waves WAVE1 to WAVE3 are aligned in sequence in the combinational circuit by feeding clock signal to flip-flops at a rate higher than the propagation delay time of the combinational circuit. That is, if all the signal paths for signal components of a wave signal extending from the input to the output of the combinational circuit have a substantially equal delay, the individual wave signals WAVE1 to WAVE3 can be propagated toward the output section without an interference between the wave signals. Wong et al. report in the article cited above a bipolar LSI of a wave-pipeline technique which achieved a pipeline frequency on the order of 2.5 times the conventional pipeline frequency (97 MHz).

In the wave-pipeline technique of FIG. 2B, the intermediate flip-flop of FIG. 2A is omitted by utilizing the self-delay time of a memory core while the output data is held in the output flip-flop. If address signals are applied to a data path with a cycle time which exceeds an access time, read-out data is not output during the self-delay of the memory core. In other word, in the memory system of the wave-pipeline technique, address input signals are applied with a period which is less than the critical path of a memory core section.

A semiconductor memory system which incorporates the wave-pipeline technique is discussed in detail in an article "A 220-MHz Pipelined 16-Mb BiCMOS SRAM with PLL Proportional Self-Timing Generator" by K. Nakamura, S. Kuhara et al., 1994 IEEE JOURNAL OF SOLID-STATE CIRCUITS, pp 1317–1322, November 1994, and also in another article (The Institute of Electronics, Information and Communication Engineers Technical Report, ICD 94-33 to 34, pp 70 to 72, May 27, 1994).

A clue to implementing the wave-pipeline technique on the semiconductor memory system lies in reducing difference in the signal delay time which is caused by different locations of memory cells being accessed or that caused by a difference between data path lengths. Referring to FIG. 4B, which will be later compared with FIG. 4A, a hatched area on the graph represents propagations of a wave signal, which have a maximum delay time difference ($\Delta tpd$) between propagations of the signal components due to the fact that the delay time for respective components of the wave signal to reach from the input flip-flop to the output flip-flop differs depending on a variation in the signal path length within an asynchronous memory core.

Since the data admission into the output flip-flop must take place within the hatched area, it is imperative for the implementation of the wave-pipeline technique which achieves a reduction in the cycle time that the maximum delay time difference $\Delta tpd$ of the hatched area or the difference in the signal delay time caused by different data paths from the memory (or the cell location being accessed) be reduced.

It is to be noted that in a memory system of a large capacity, a refinement in the process results in a reduced aluminium film thickness, and a reduction in size of a memory cell also results in a reduced aluminium line width.

As the capacity increases, there is a tendency that signal wiring and bit lines, which use aluminium, increase. This means that a resistance presented by the signal wiring and the bit line increases, posing a problem in that a signal delay time caused by the signal wiring and the bit lines increases as does a difference in the signal delay time caused by differences of data paths.

SUMMARY OF THE INVENTION

Accordingly, it is an object of the present invention to provide a semiconductor memory system in which a reduction in the cycle time is achieved by reducing a difference in the signal delay time caused by differences of data paths, thus enabling the operational frequency to be enhanced in a wave-pipeline technique.

In accordance with a first aspect of the present invention, there is provided a semiconductor memory system comprising an input flip-flop for receiving input address signals in sequence, an address decoder for decoding each of the input address signals to generate a selection signal, a memory cell array having a plurality of memory cells arranged in an array, one of the memory cells being selected by the selection signal, a read-out section for reading out data from selected one of the memory cells to generate a data signal, an output flip-flop for outputting the data signal outside the memory system, each of the input flip-flop, address decoder, memory cell array, read-out section and output flip-flop defining a plurality of signal paths for respective signal components of one of the signals, the plurality of signal paths including a first signal path and a second signal path which has a path length larger than a path length of the first signal path, and a delay section for providing a first delay time to the first signal path.

Also, in accordance with a second aspect of the present invention, there is provided a semiconductor memory system comprising an input flip-flop for receiving input address signals in sequence, an address decoder for decoding each of the input address signals to generate a selection signal, a memory cell array having a plurality of memory cells arranged in an array, one of the memory cells being selected by the selection signal, a read-out section for reading out data from selected one of the memory cells to generate a data signal, an output flip-flop for outputting the data signal outside the memory system, each of the input flip-flop, address decoder, memory cell array, read-out section and output flip-flop defining a plurality of signal paths for respective signal components of a corresponding one of the signals, the plurality of signal paths including a first signal path and a second signal path which has a path length larger than a path length of the first signal path, at least one of the address decoder and read-out section has a first driver for driving the first signal path and a second driver for driving the second signal path, the first driver has a first current drivability larger than a second current drivability of the second driver.

Furthermore, in accordance with a third aspect of the present invention, there is provided a semiconductor memory system comprising an input flip-flop for receiving input address signals in sequence, an address decoder for decoding each of the input address signals to generate a selection signal, a memory cell array having a plurality of memory cells arranged in an array, a plurality of pairs of bit lines extending in a column direction, a plurality of word lines extending in a row direction, each of the pair of bit lines and each of the plurality of word lines being responsive to corresponding selection signal for selecting one of the memory cells, a read-out section for reading out data from selected one of the memory cells to generate a data signal, an output flip-flop for outputting the data signal outside the memory system, a pair of charge section, each having a variable resistance responsive to the selection signal to thereby reduce the difference between voltage drops at the memory cells connected in one of the pairs of bit lines.

It is preferred in the first and second aspect of the present that a load element for a bit line comprises a plurality of MOS transistors connected in parallel and that a plurality of memory cells are divided into a plurality of groups in accordance with a relative location from the load circuit, thus selectively controlling the turn on/off of the plurality of MOS transistors depending on a particular group to which a selected memory cell belongs.

It is preferred in the third aspect of the present invention that the plurality of memory cells connected to a bit line pair are divided into a plurality of groups depending on the location of the portion of the bit line relative to the load element and that gate voltages of MOS transistors, which constitute the charge sections for the bit lines, are selectively changed in accordance with the group to which a selected memory cell belongs.

In accordance with the first and second aspect of the present invention, the difference in the signal delay time caused by differences of data path lengths can be reduced, whereby the cycle time can be reduced, enabling an enhancement of the operational frequency in the wave-pipeline technique.

In the third aspect of the present invention, the load element or charge section for the bit line has a variable resistance which can be varied dependently of the location of the portion of the bit line to which the selected memory cell is connected, thus allowing a difference in potential swing or voltage drop on the bit line to be reduced and thus a difference between delay times to be drastically reduced in reading operation as compared with the prior art arrangement.

Accordingly, the present invention, when applied to the wave-pipeline technique, reduces the cycle time for signal transmission to thereby enhance the operational frequency of the system. In addition, the present invention enables an enhancement in the operational speed in another type of memory system which is not arranged to perform a wave-pipeline operation.

It will be seen from the following description that a reduction of a difference in the signal delay time caused by differences of data paths or caused by bit lines for memory cell array enables an enhancement of the operational frequency in the wave-pipeline technique.

BRIEF DESCRIPTION OF THE DRAWINGS

FIG. 2A is a schematic illustration for operation of the conventional pipeline technique applied to a semiconductor memory system;

FIG. 2B is a schematic illustration of a wave-pipeline technique applied to a semiconductor memory system;

DESCRIPTION OF PREFERRED EMBODIMENTS

Referring to the accompanying drawings, preferred embodiments of the present invention will now be described.

Embodiment 1

Figure 1:
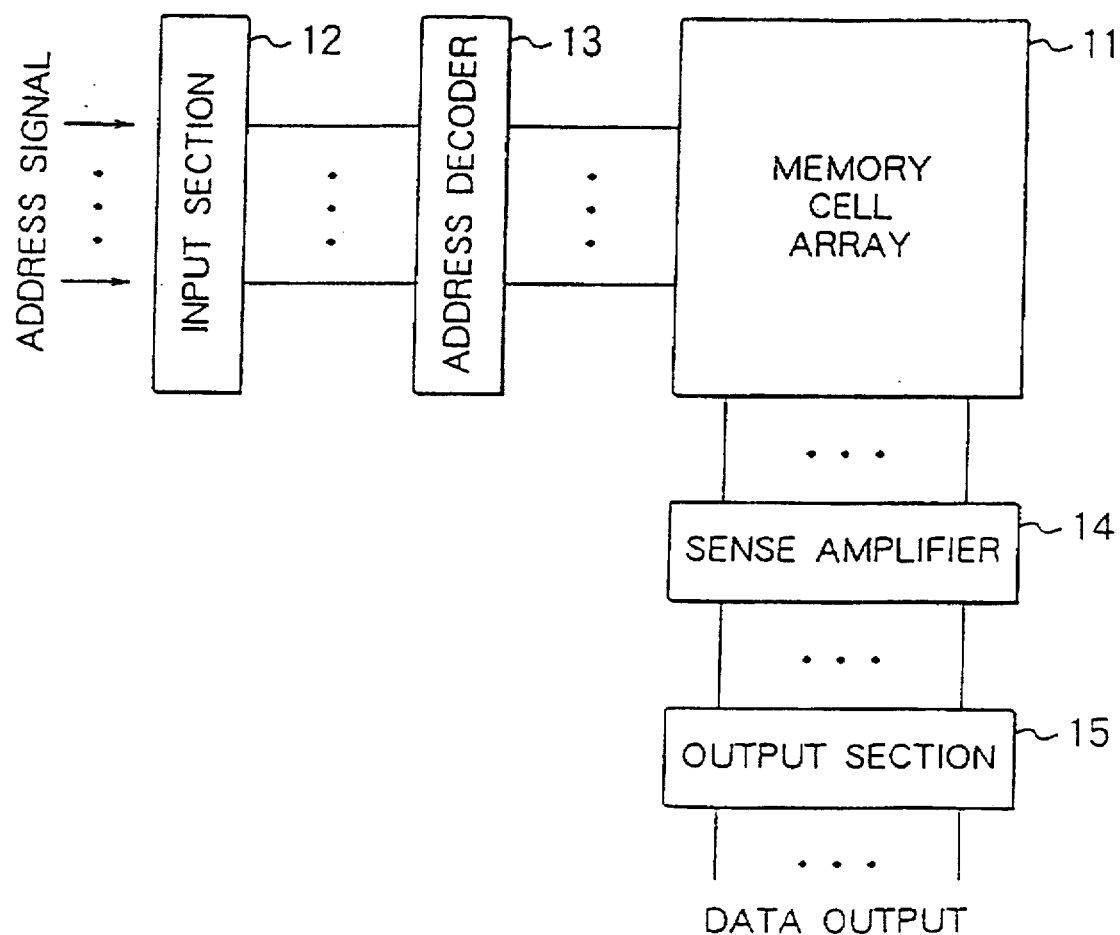
FIG. 1 is a schematic illustration of a conventional semiconductor memory system.
Figure 3:
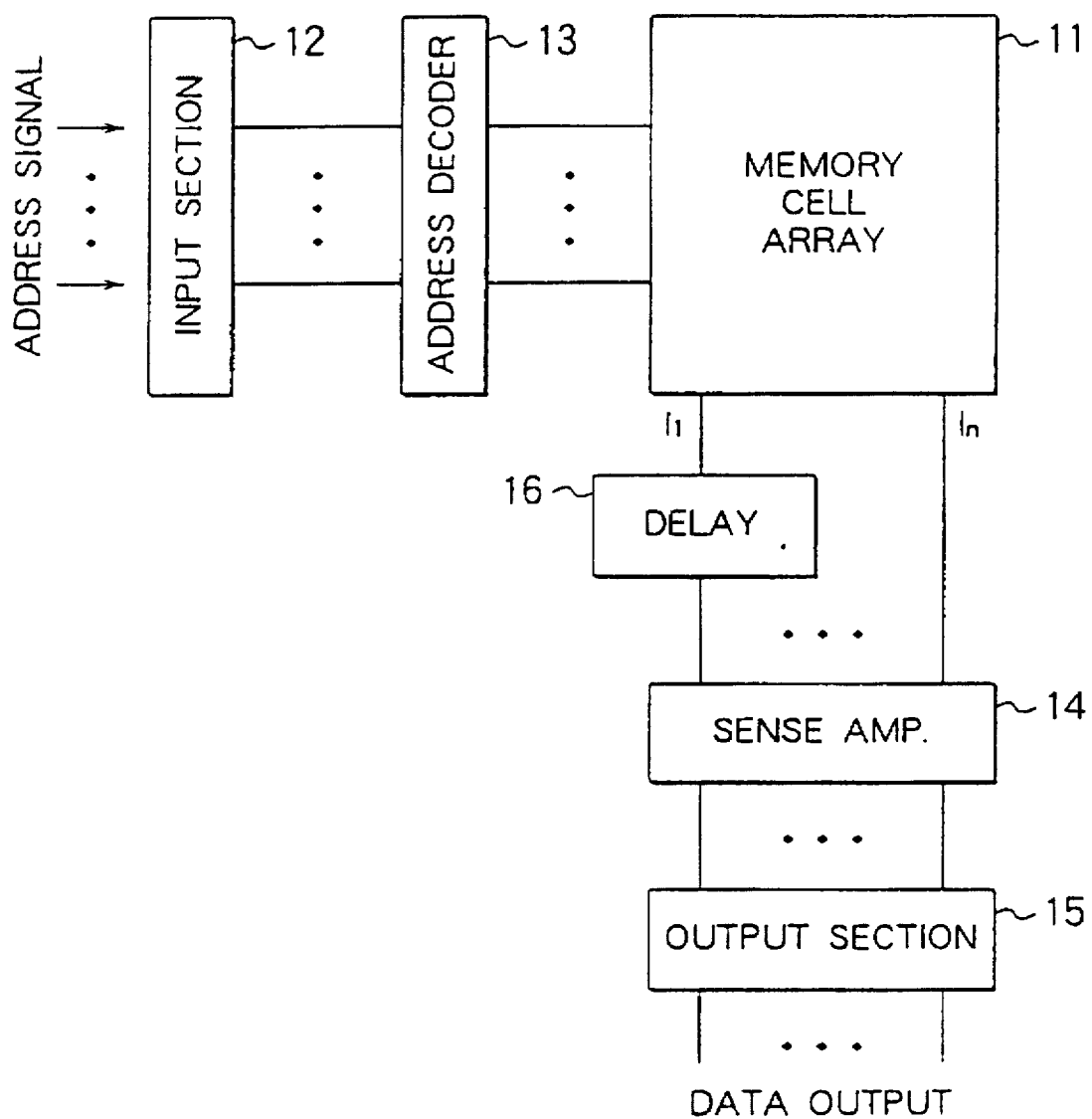
FIG. 3 is a schematic illustration of a semiconductor memory system according to a first embodiment of the present invention.

FIG. 3 shows a semiconductor memory system according to a first embodiment of the present invention, which also illustrates the principle of the present invention. It is to be noted that similar reference numerals as used in FIG. 1 are used in FIG. 3 to designate corresponding elements, for the sake of understanding.

As shown in FIG. 3, the memory system includes an input section 12 for receiving an address signal input to the memory system, an address decoder 13 for decoding the address signal to select a memory cell, a memory cell array 11 having a plurality of memory cells arranged in an array, a sense amplifier 14 for detecting the data read out from a selected memory cell, an output section 15 for outputting the cell data stored in the selected memory cell outside the memory system, and a plurality of delay elements or delay sections 16 each for delaying a corresponding signal component on each of the signal paths $l_1$ to $l_{n-1}$ in accordance with the length of the each of the signal paths. Both the input section 12 and the output section 15 are implemented by flip-flops whereby the entire circuit operates as a combinational circuit.

The delay sections 16 have respective delay times depending on the lengths of the respective signal paths $l_1$ to $l_{n-1}$ each extending between the input section 12 and the output section. Namely, each delay circuit 16 has a delay time in accordance with the path length of the corresponding signal path to thereby equalize the delay times for the signal components of a single wave signal propagating from the input section 12 to the output section 15 in each cycle time.

Figure 4A:
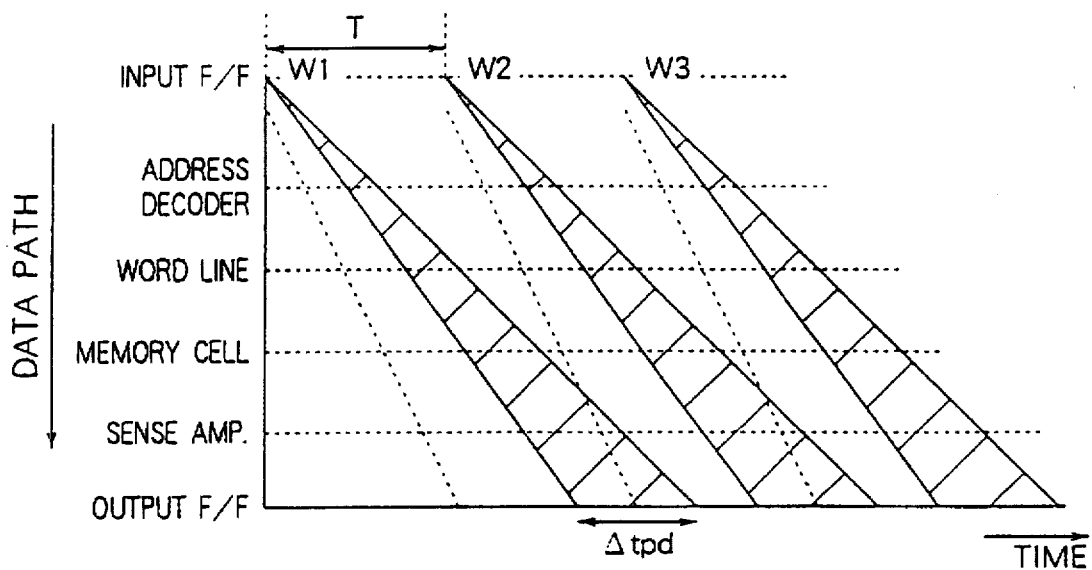
FIGS. 4A and 4B graphically illustrate relationship between the data paths and a maximum difference in the signal delay time, wherein FIG. 4A applies to the present invention while FIG. 4B applies to the prior art.
Figure 4B:
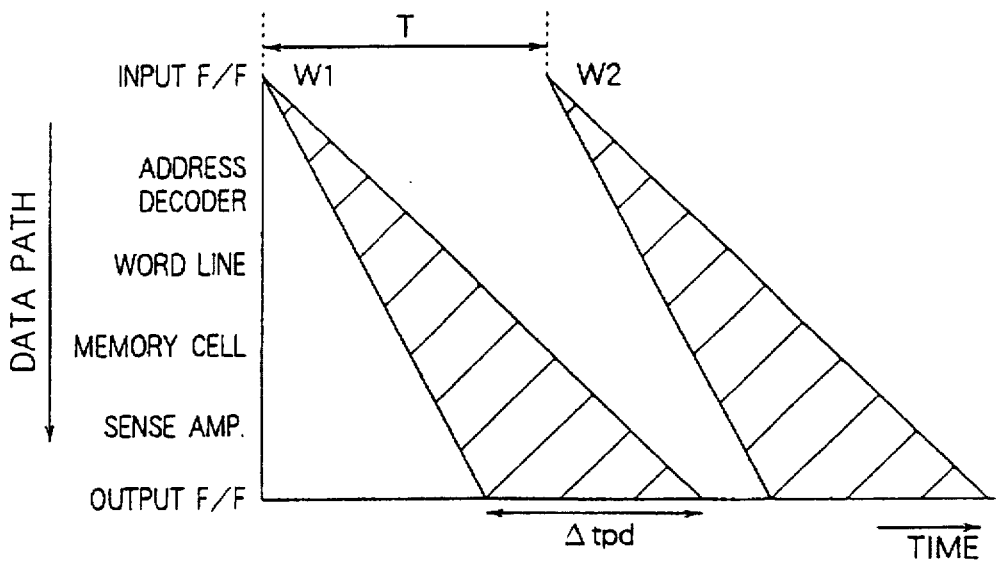

FIGS. 4A and 4B show propagation delays generated along the signal paths in the memory systems of FIG. 3 and the conventional memory system, respectively. As will be understood by comparison of FIG. 4A with FIG. 4B, in the present embodiment, the maximum delay time difference Δtpd during propagation of the wave signals W1, W2, . . . from the input section (input F/F) to the output section (output F/F) is reduced as compared to that in the conventional system, due to the function of the delay sections 16 in FIG. 3 which equalize the propagation delays generated along different signal paths. The reduction in the maximum delay time difference Δtpd enables a smaller cycle time T in the present embodiment, which in turn enables enhancement of the operational frequency of the memory system.

Embodiment 2

Figure 5:
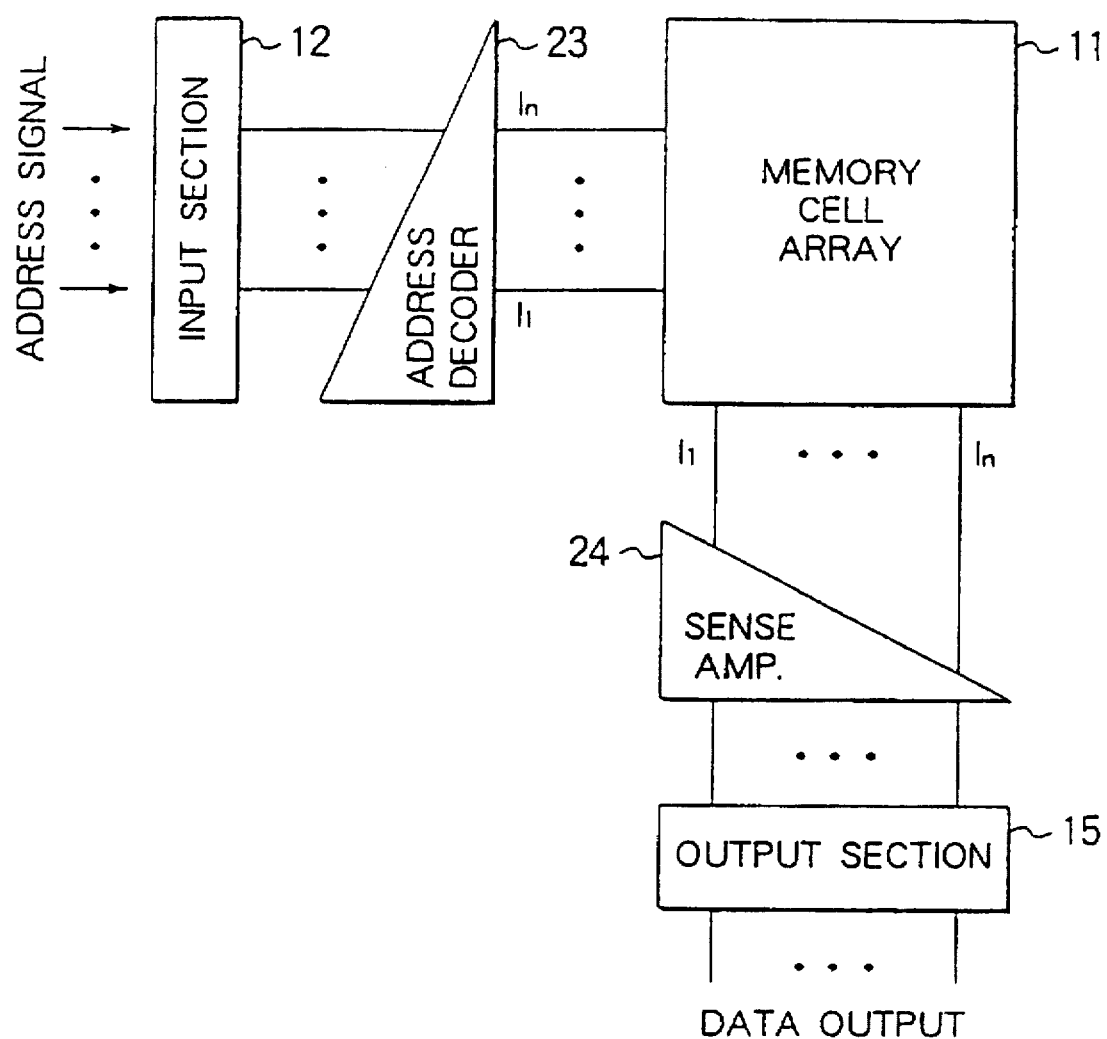
FIG. 5 is a schematic illustration of a semiconductor memory system according to a second embodiment of the present invention.

FIG. 5 shows a semiconductor memory system according to a second embodiment of the present invention. The structure of the present embodiment is similar to that of the first embodiment except that the delay sections 16 in the first embodiment are replaced by specific structures of the address decoder 23 and the sense amplifier 24. In this configuration, driver transistors included in each of the address decoder 23 and the sense amplifier 24 have different current drivabilities from one other, as schematically shown by the triangular shapes of the address decoder 23 and the sense amplifier 24.

Namely, one of the driver transistors in the address decoder 23 or sense amplifier disposed for one of the signal paths $l_1$ to $l_n$ which has a larger path length has a larger current drivability than that of another of the driver transistors disposed in a signal path having a smaller path length. In the drawing, the direction of the taper in the triangles for the address decoder 23 and sense amplifier 24 indicates the direction for a larger current drivability for less delaying respective signal components. In other word, a signal path having a smaller path length includes driver transistors having a smaller current drivability in the address decoder 23 and the sense amplifier 24, for achieving a small difference between the propagation delay times of the signal components, thereby obtaining a similar effect as achieved in the first embodiment.

Embodiment 3

Figure 6:
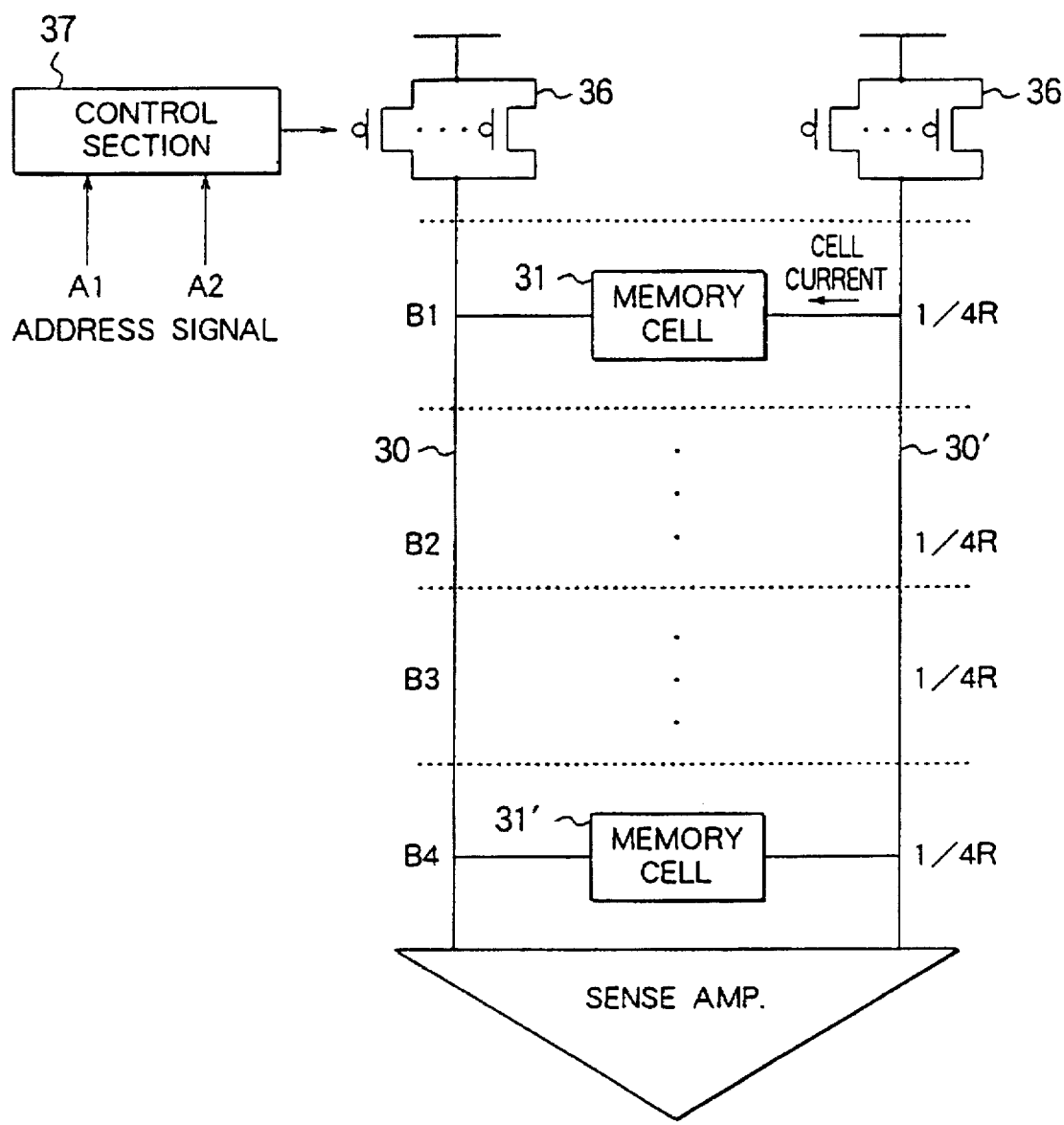
FIG. 6 is a schematic illustration of a semiconductor memory system according to a third embodiment of the present invention.

FIG. 6 shows a semiconductor memory system according to a third embodiment of the present invention, wherein the portion of the memory system shown in the drawing includes a pair of bit lines 30 and 30', a plurality of memory cells 31, . . . , 31' arranged in a column, a sense amplifier 34 and a control section 37 disposed for the bit line pair 30 and 30'. The memory cells 30, . . . , 31' are divided into a plurality of (four, in this example) groups depending on the location of the block 81 to B4 of the bit lines 30 and 30' to which the specific memory cell is connected.

The memory system also includes a pair of load sections or charge sections 36 and 36' disposed for charging the pair of bit lines 30 and 30'. Each of the load sections 36 and 36' is formed of a plurality of MOS transistors connected in parallel to one another. The gate of each of the MOS transistors in the load sections 36 and 36' is supplied with a control signal from the control section 37 which receives a row address signal including two bits A1 and A2. The load sections 36 and 36' are controlled to vary the resistance thereof by the address signal A1 and A2 so that each of the load sections 36 and 36' provides a variable resistance depending on the location of the memory cell being selected on the pair of bit lines 30 and 30'.

Figure 7:
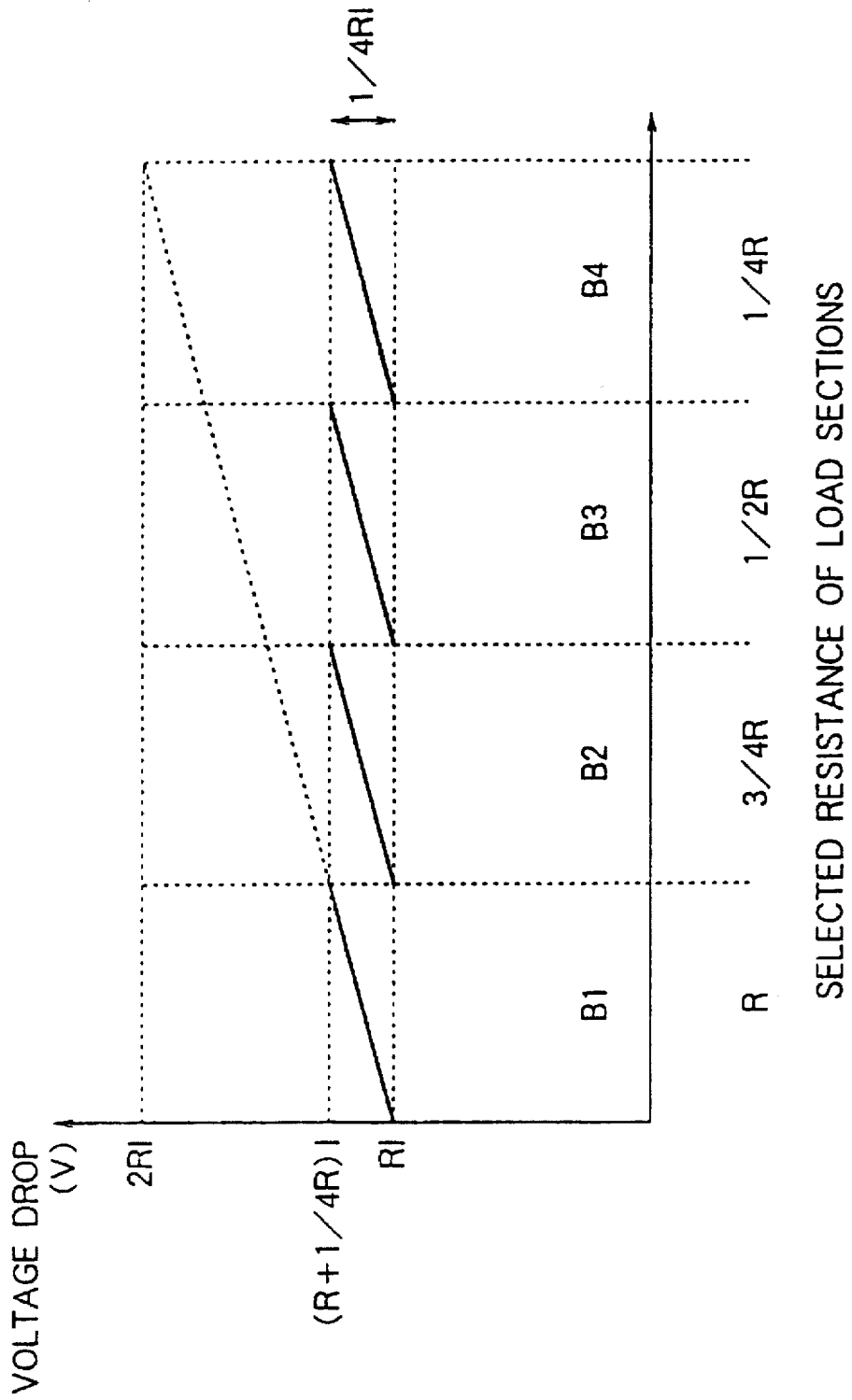
FIG. 7 is a graphical illustration of the voltage drop on the bit line in the third embodiment.

FIG. 7 shows relationship between selected resistance of the load section and voltage drops on the bit line. It is assumed in FIGS. 6 and 7 that the resistance of each of the MOS transistors in the load sections 36 and 36' as well as the resistance of the entire bit line is equal to R for simplification purpose. The bit line pair 30 and 30' is divided into four blocks B1, B2, B3 and B4, as mentioned above, so that the resistance per block of one of the bit lines is equal to ¼ R. A particular memory cell in which one of the four blocks B1 to B4 is to be read is determined by two-bit address signal by specifying a row address A1 and A2.

The row address A1 and A2 input to a control section 37 controls the gate voltages applied to the plurality of the load MOS transistors so as to control the number of the load MOS transistors to be turned on such that the resultant on-resistance presented by the load section 36 or 36' is equal to R when a memory cell 31 located within the block B1 is being read, equal to ¾ R for a memory cell in the block B2, equal to ½ R for a memory cell in the block B3, and equal to ¼ R for a memory cell in the block B4.

When the memory cell 31 in the block B1 is to be read, the bit line pair 30 and 30' is first precharged to a source potential, for example, and a cell current I flows to one of the pair of bit lines 30 and 30' connected to one of the internal nodes within the selected memory cell 31 assuming a lower potential, whereby the potential of the one of the bit lines 30 and 30' drops from the source potential by an amount corresponding to a voltage drop produced by the cell current I across the serial resistance comprising the resistances of the load sections and the one of the bit lines. The other of the bit lines connected to the other of internal nodes within the selected memory cell 31 which assumes a higher potential does not conduct substantially any current and hence remains substantially at the source potential.

As shown by solid lines in FIG. 7, when a memory cell in any one of the four blocks B1, B2, B3 and B4 is selected, the serial resistance presented by the combination of the bit line load circuits 36 and 36' and the bit line lies in a range from R to 5/4 R. In this case, the maximum variation in the potential difference (excursion) between the bit line pair upon reading out a memory cell can be suppressed to ¼ RI. By contrast, in a conventional arrangement, the excursion on the bit line pair upon reading out the selected memory cell is equal to a voltage drop RI. Accordingly, a reduction is obtained in the present embodiment down to one-quarter the excursion on the bit line in the conventional technique, namely, RI, as shown in the broken line in FIG. 7.

For the convenience of description, an arrangement has been illustrated in which two bits A1 and A2 are supplied as an address signal to the control circuit 37 to divide the bit line into four blocks B1 to B4. However, by increasing the number of bits thus supplied, it is possible to achieve a further reduction in a maximum excursion on the bit lines. Thus, when n bits are used, the bit line can be divided into a number of blocks which is equal to $2^n$, thus enabling a maximum excursion on the bit lines to a level corresponding to ½".

Embodiment 4

Figure 8:
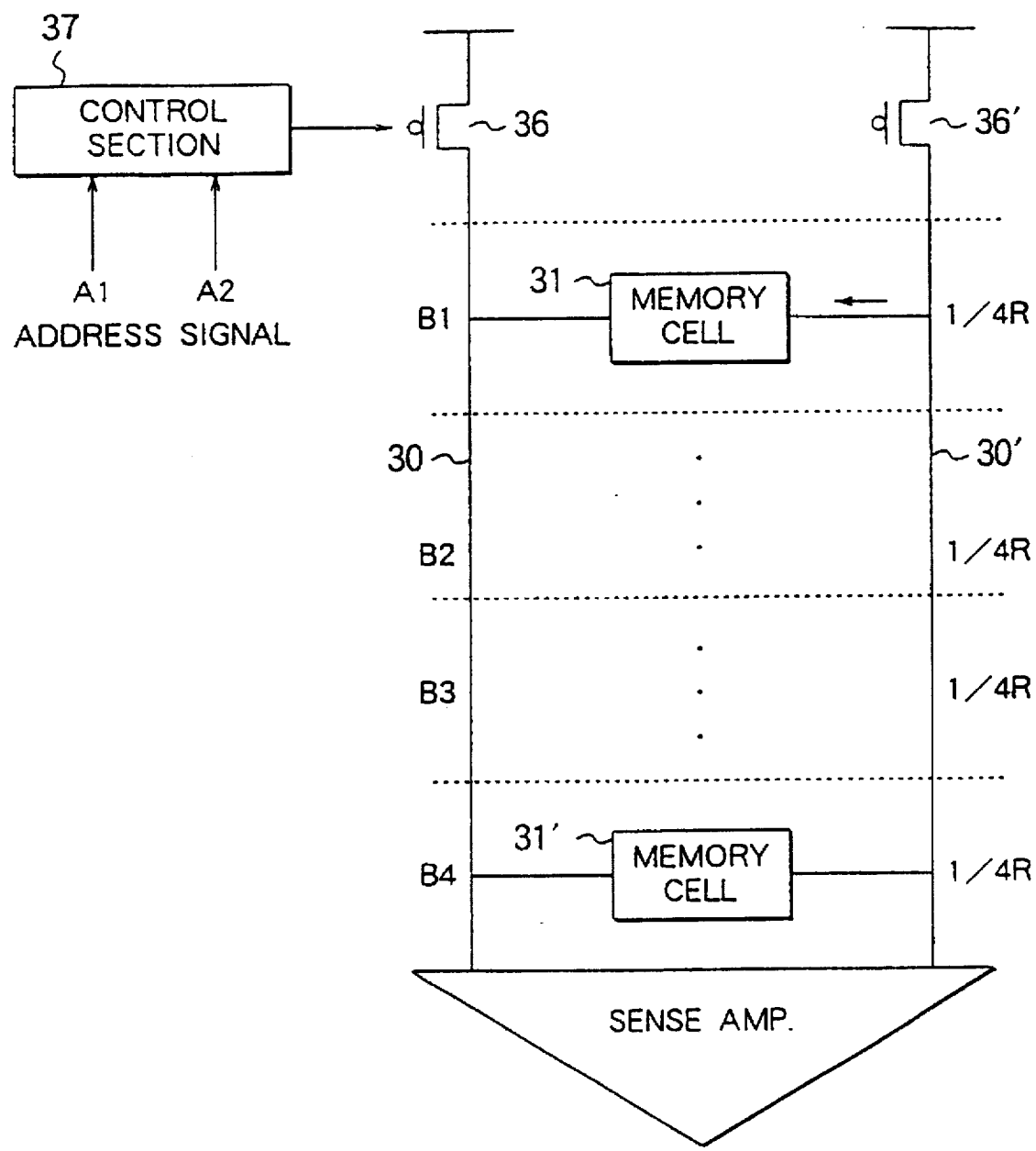
FIG. 8 is a schematic illustration of a semiconductor memory system according to a fourth embodiment of the present invention.

FIG. 8 shows a memory system according to a fourth embodiment of the present invention. In contradistinction to the third embodiment mentioned above, in the present embodiment, an arrangement to control the bit line load resistance is implemented by changing a gate voltage applied to a single load MOS transistor of the load section 36 or 36'. Thus, in the present embodiment, a control circuit 38 receives an address signal comprising two bits A1 and A2 and delivers the gate voltage so as to achieve a suitable and a variable change in the on resistance presented by the load MOS transistors 36 and 36' in accordance with the location of the block, of all four blocks B1, B2, B3 and B4, to which the selected memory cell belongs. Again, the resistance of the load circuit is variably controlled depending on the location of the block, to which the selected memory cell belongs, in a manner similar to that in the third embodiment.

In the third and fourth embodiments, a maximum delay time difference caused by bit lines is suppressed by reducing a maximum excursion on the bit lines, and accordingly, the operational speed can be enhanced even in a memory system which does not perform a wave-pipeline operation. That is, by reducing the difference in the voltage drop on the bit line, a difference in bit line delay time can be drastically reduced. This allows the operational frequency to be enhanced through reducing the cycle time T as shown in FIG. 4A when the present invention is applied to a semiconductor memory system of a wave-pipeline technique, and also allows an enhanced operational frequency in a memory system which is not arranged to perform a wave-pipeline operation.

The memory systems illustrated in connection with the above embodiments are preferred for use in a memory core of a high speed SRAM (static random access memory) of a large capacity, which may be used in a cache memory for example, in which a high speed CPU and a high speed bus are directly coupled together in order to achieve a high speed operation as high as 220 MHz, that is comparable to the high speed CPU.

However, those embodiments may be applicable to a high-speed semiconductor memory system of a large capacity other than SRAM, such as DRAM (dynamic random access memory). In addition, it is to be noted that while the present invention has been disclosed above in connection with several embodiments, it should be understood that the present invention is not limited to the precise embodiments but that the present invention has various forms of embodiments without departing from the spirit and the scope of the present invention.

What is claimed is:

1. A semiconductor system comprising an input flip-flop for receiving input address signals in sequence, an address decoder for decoding each of said input address signals to generate a selection signal, a memory cell array having a plurality of memory cells arranged in an array, one of said memory cells being selected by said selection signal, a read-out section for reading out data from selected one of said memory cells to generate a data signal, an output flip-flop for outputting said data signal outside said memory system, each of said input flip-flop, address decoder, memory cell array, read-out section and output flip-flop defining a plurality of signal paths for respective signal components of a corresponding one of said signals, said plurality of signal paths including a first signal path and a second signal path which has a path length larger than a path length of said first signal path, at least one of said address decoder and read-out section has a first driver for driving said first signal path and a second driver for driving said second signal path, said first driver has a first current drivability larger than a second current drivability of said second driver.

2. A semiconductor memory system as defined in claim 1 wherein said plurality of signal paths further include a third signal path having a path length between the path lengths of said first signal path and second signal path, said at least one of said address decoder and read-out section further has a third driver having a third current drivability between said first current drivability and second current drivability.

3. A semiconductor system as defined in claim 1 wherein said input address signals are wave-pipeline signals.

4. A semiconductor system comprising an input flip-flop for receiving input address signals in sequence, an address decoder for decoding each of said input address signals to generate a selection signal, a memory cell array having a plurality of memory cells arranged in an array, a plurality of pairs of bit lines extending in a column direction, a plurality of word lines extending in a row direction, each of said pair of bit lines and each of said plurality of word lines being responsive to corresponding selection signal for selecting one of said memory cells, a read-out section for reading out data from selected one of said memory cells to generate a data signal, an output flip-flop for outputting said data signal outside said memory system, a pair of charge section, each having a variable resistance responsive to said selection signal to thereby reduce the difference between voltage drops of said memory cells connected in one of said pairs of bit lines.

5. A memory system as defined in claim 4 wherein said plurality of memory cells connected in one of said pair of bit lines are grouped in a plurality of cell groups in accordance with the location thereof in said column direction, each of said charge sections has a plurality of transistors connected in parallel to one another, and the number of said transistors are controlled by said selection signal to thereby effect said reducing the difference between voltage drops.

6. A memory section as defined in claim 4 wherein each of said charge sections includes a transistor having a control electrode controlled by said selection wave signal to thereby effect reducing the difference between voltage drops.

7. A semiconductor system as defined in claim 4 wherein said input signals are wave-pipeline signals.

* * * * *